United States Patent
Kittl

(10) Patent No.: US 9,966,449 B2
(45) Date of Patent: May 8, 2018

(54) METHODS OF FORMING SEMICONDUCTOR DEVICES, INCLUDING FORMING A CONTACT INCLUDING AN ALKALINE EARTH METAL ON A SEMICONDUCTOR LAYER, AND RELATED DEVICES

(71) Applicant: Samsung Electronics Co., Ltd., Suwon-si (KR)

(72) Inventor: Jorge A. Kittl, Round Rock, TX (US)

(73) Assignee: Samsung Electronics Co., Ltd. (KR)

( * ) Notice: Subject to any disclaimer, the term of this patent is extended or adjusted under 35 U.S.C. 154(b) by 824 days.

(21) Appl. No.: 14/226,192

(22) Filed: Mar. 26, 2014

(65) Prior Publication Data

US 2015/0115446 A1    Apr. 30, 2015

Related U.S. Application Data

(60) Provisional application No. 61/898,016, filed on Oct. 31, 2013.

(51) Int. Cl.
H01L 29/45    (2006.01)
H01L 21/285    (2006.01)

(52) U.S. Cl.
CPC ........ *H01L 29/45* (2013.01); *H01L 21/28512* (2013.01); *H01L 29/456* (2013.01)

(58) Field of Classification Search
CPC .. H01L 29/45; H01L 21/28512; H01L 29/459
See application file for complete search history.

(56) References Cited

U.S. PATENT DOCUMENTS

| | | | |
|---|---|---|---|
| 6,121,727 A | 9/2000 | Kanal et al. | |
| 7,750,553 B2 | 7/2010 | Ito | |
| 8,298,927 B2 | 10/2012 | Xu et al. | |
| 2010/0155954 A1 | 6/2010 | Mukherjee et al. | |
| 2012/0161321 A1 | 6/2012 | Haverty et al. | |
| 2012/0325297 A1 | 12/2012 | Naito et al. | |
| 2013/0075832 A1* | 3/2013 | Gassilloud | H01L 21/28088 257/410 |
| 2013/0130407 A1 | 5/2013 | Wang | |
| 2014/0138777 A1* | 5/2014 | Wang | G11C 17/16 257/379 |

OTHER PUBLICATIONS

McKee et al., "BaSi$_2$ and thin film alkaline earth silicides on silicon", Applied Physics Letters, vol. 63, Issue 20, pp. 2818-2820, Published Date: Nov. 15, 1993.

* cited by examiner

Primary Examiner — Steven Loke
Assistant Examiner — Krista Soderholm
(74) Attorney, Agent, or Firm — Myers Bigel, P.A.

(57) ABSTRACT

Methods of forming a semiconductor device are provided. A method of forming a semiconductor device may include forming a metal contact that includes a heavy alkaline earth metal on an n-type semiconductor layer. The heavy alkaline earth metal may underlie a metal layer and/or a capping layer. Related semiconductor devices are also provided.

17 Claims, 14 Drawing Sheets

| |
|---|
| Capping Layer 120 |
| Other Metal 110-B |
| Heavy AEM 110-A' |
| Other Metal 110-B |
| Heavy AEM 110-A' |
| Other Metal 110-B |
| Heavy AEM 110-A' |
| Insulator Layer 105 |
| N-type Semiconductor Layer 100 |

| Capping Layer |
| 120 |
| Other Metal |
| 110-B |
| Heavy AEM |
| 110-A' |
| Insulator Layer |
| 105 |
| N-type Semiconductor Layer |
| 100 |

FIGURE 1D

| Capping Layer |
| 120 |
| Other Metal |
| 110-B |
| Heavy AEM |
| 110-A' |
| Chalcogenide Interface Passivation |
| 106 |
| N-type Semiconductor Layer |
| 100 |

FIGURE 1E

| |
|---|
| Capping Layer 120 |
| Other Metal 110-B |
| Heavy AEM 110-A' |
| Other Metal 110-B |
| Heavy AEM 110-A' |
| Other Metal 110-B |
| Heavy AEM 110-A' |
| Insulator Layer 105 |
| N-type Semiconductor Layer 100 |

FIGURE 1F

| |
|---|
| Capping Layer 120 |
| Alloy w/ Heavy AEM 110-A |
| Heavy AEM 110-A' |
| Insulator Layer 105 |
| N-type Semiconductor Layer 100 |

FIGURE 1G

METHODS OF FORMING SEMICONDUCTOR DEVICES, INCLUDING FORMING A CONTACT INCLUDING AN ALKALINE EARTH METAL ON A SEMICONDUCTOR LAYER, AND RELATED DEVICES

CLAIM OF PRIORITY

The present application claims the benefit of U.S. Provisional Patent Application Ser. No. 61/898,016, filed on Oct. 31, 2013, entitled Low Interface Contact Resistivity Heavy Alkaline Earth Metal Containing Contacts to N-type Semiconductors, the disclosure of which is hereby incorporated herein in its entirety by reference.

FIELD

The present disclosure generally relates to the field of semiconductor devices and, more particularly, to contacts on semiconductor layers.

BACKGROUND

The performance characteristics of a semiconductor device may be affected by the composition of a contact to a semiconductor layer in the semiconductor device. For example, the contact materials may be relatively poor conductors, thus limiting current flow via the contact. Accordingly, the selection of materials for the contact to the semiconductor layer may impact the performance characteristics of the semiconductor device.

SUMMARY

Various embodiments of the present disclosure may provide a method of forming a semiconductor device. The method may include forming a metal contact that includes a solid, conductive, metallic alloy including a heavy alkaline earth metal at an interface with an n-type semiconductor layer. The alloy including the heavy alkaline earth metal may include a thickness of no more than about 10.0 nanometers. Moreover, the method may include in-situ forming a metal layer and/or a capping layer on the alloy including the heavy alkaline earth metal.

In various embodiments, in-situ forming the metal layer and/or the capping layer may include forming the metal layer and/or the capping layer on the alloy that includes the heavy alkaline earth metal without substantially oxidizing or reacting the heavy alkaline earth metal. Moreover, in-situ forming the metal layer and/or the capping layer may include in-situ forming a non-alkaline-earth metal layer on the alloy that includes the heavy alkaline earth metal. In some embodiments, in-situ forming the metal layer and/or the capping layer includes in-situ forming the capping layer on the non-alkaline-earth metal layer.

According to various embodiments, a percentage composition of the heavy alkaline earth metal in the alloy may be less than about 20%. The alloy may also include a non-alkaline-earth metal, and forming the metal contact that includes the alloy may include forming the metal contact that includes the alloy including the non-alkaline-earth metal and the less than about 20% percentage composition of the heavy alkaline earth metal. Moreover, the heavy alkaline earth metal may include Barium, Strontium, and/or Calcium, and forming the metal contact that includes the alloy may include forming the metal contact that includes the alloy including the non-alkaline-earth metal and the less than about 20% percentage composition of the Barium, Strontium, and/or Calcium.

A method of forming a semiconductor device, according to various embodiments, may include forming a solid, conductive metal contact that includes a substantially unoxidized heavy alkaline earth metal on an n-type semiconductor layer. The substantially unoxidized heavy alkaline earth metal may underlie a metal layer and/or a capping layer. In some embodiments, the method may include forming the metal layer and/or the capping layer on the heavy alkaline earth metal without substantially oxidizing or reacting the heavy alkaline earth metal. Moreover, in some embodiments, the method may include performing an ex-situ operation on a structure that includes the heavy alkaline earth metal and the metal layer and/or the capping layer, after forming the metal layer and/or the capping layer on the heavy alkaline earth metal.

In various embodiments, the method may include forming an insulator layer on the n-type semiconductor layer, and forming the solid, conductive metal contact may include forming the solid, conductive metal contact that includes the heavy alkaline earth metal on the insulator layer. Moreover, the insulator layer may include a thickness of no more than about 2.0 nanometers (nm) on the n-type semiconductor layer, the heavy alkaline earth metal may include a thickness of no more than about 10.0 nm on the insulator layer, and forming the solid, conductive metal contact may include forming the solid, conductive metal contact that includes the heavy alkaline earth metal including the thickness of no more than about 10.0 nm on the insulator layer including the thickness of no more than about 2.0 nm.

According to various embodiments, forming the solid, conductive metal contact may include forming the solid, conductive metal contact that includes the heavy alkaline earth metal at an interface with the n-type semiconductor layer. Additionally or alternatively, the method may include forming a chalcogenide material on the n-type semiconductor layer, and forming the solid, conductive metal contact may include forming the solid, conductive metal contact that includes the heavy alkaline earth metal on the chalcogenide material.

In various embodiments, forming the solid, conductive metal contact may include implanting the heavy alkaline earth metal into the n-type semiconductor layer, and may include forming the metal layer on the heavy alkaline earth metal to cause a reaction that moves the heavy alkaline earth metal to a surface of the n-type semiconductor layer. Moreover, in some embodiments, forming the solid, conductive metal contact may include forming the metal layer on the n-type semiconductor layer, forming the capping layer on the metal layer, implanting the heavy alkaline earth metal through the capping layer into the metal layer, and performing a thermal operation to move the heavy alkaline earth metal toward a surface of the n-type semiconductor layer.

According to various embodiments, the metal contact may include a solid, conductive, metallic alloy including the heavy alkaline earth metal, and forming the solid, conductive metal contact may include forming the solid, conductive metal contact that includes the solid, conductive, metallic alloy including the heavy alkaline earth metal on the n-type semiconductor layer. Moreover, the semiconductor device may include a Metal-Oxide-Semiconductor (MOS) device, the n-type semiconductor layer may be an n-type source region or an n-type drain region of the MOS device, and forming the solid, conductive metal contact may include forming the solid, conductive metal contact that includes the heavy alkaline earth metal on the n-type source region or the n-type drain region of the n-type semiconductor layer.

In various embodiments, the heavy alkaline earth metal may include Barium, Strontium, and/or Calcium, and forming the solid, conductive metal contact may include forming the solid, conductive metal contact that includes Barium, Strontium, and/or Calcium on the n-type semiconductor layer. Moreover, the alkaline earth metal may include Calcium, and forming the solid, conductive metal contact may include forming the solid, conductive metal contact that includes the alkaline earth metal including Calcium on the n-type semiconductor layer.

A semiconductor device, according to various embodiments, may include an n-type semiconductor layer. The semiconductor device may include a substantially non-oxidized metal contact that includes a solid, conductive, metallic alloy including a heavy alkaline earth metal at an interface with the n-type semiconductor layer, and the alloy that includes the heavy alkaline earth metal may include a thickness of no more than about 10.0 nanometers. The semiconductor device may include a metal layer and/or a capping layer on the alloy that includes the heavy alkaline earth metal. Moreover, the heavy alkaline earth metal may include Barium, Strontium, and/or Calcium, and the alloy may include a non-alkaline-earth metal and a percentage composition of less than about 20% of the Barium, Strontium, and/or Calcium.

Other methods and devices according to embodiments of the present disclosure will be or become apparent to one with skill in the art upon review of the following drawings and detailed description. It is intended that all such additional methods and devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

FIGS. 1A-1J are cross-sectional views illustrating semiconductor devices, according to various embodiments of the present inventive concepts.

DETAILED DESCRIPTION

Figure 1A:
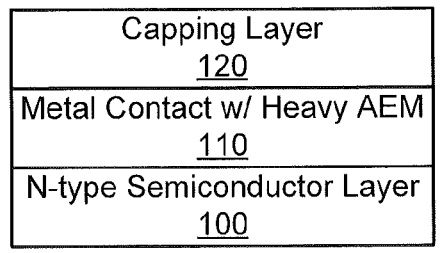

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present inventive concepts should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

As used herein, the term "in-situ" specifies that the "in-situ" operation is performed subsequently to the previous operation, without exposure to an oxidizing ambient during or in between these operations. As an example, a capping layer deposited "in-situ" on an alloy including a heavy alkaline earth metal indicates that the capping layer is deposited subsequently to the formation of the alkaline earth metal, without exposing the alkaline earth metal layer to an oxidizing ambient. Moreover, the term "capping layer," as used herein, specifies a layer of a material that protects underlying layers from oxidation.

In any deposition operation described herein involving deposition of a heavy alkaline earth metal (AEM) or an alloy including a significant amount of a heavy AEM (that may make it susceptible to easy oxidation), the deposition ambient will not be an oxidizing ambient, and the heavy AEM or alloy including the heavy AEM may therefore be substantially un-oxidized during deposition. Once a heavy AEM or alloy including a heavy AEM is deposited, it may be kept within non-oxidizing ambients until an adequate metal layer or capping layer protects it from oxidation. Any subsequent operations performed after deposition of the heavy AEM or alloy including the heavy AEM, including deposition of layers on top of the heavy AEM or alloy including the heavy AEM, may be performed in non-oxidizing ambients, until an adequate oxidation protecting layer is in place to protect the underlying heavy AEM or alloy including the heavy AEM from oxidation.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

As appreciated by the present inventive entity, heavy alkaline earth metals (AEMs) have very low Work Functions (WFs) and may therefore provide low-resistivity contacts (i.e., contacts providing a good conduction path) to n-type semiconductors. Heavy AEMs are very reactive, however, and may oxidize or react with an ambient very easily and readily, thus making heavy AEMs difficult to process or incorporate into devices. Accordingly, various embodiments of the present inventive concepts provide operations of forming a semiconductor device that includes a low-resistivity contact to an n-type semiconductor, and further provide that reactive metals (such as heavy AEMs of low-resistivity contacts) may not be exposed directly (i.e., may not be exposed without a capping layer) to reactive ambients during any subsequent processes. For example, a capping layer may be maintained in place, or may be replaced by other capping layers that act as reaction barriers, during any subsequent processes.

FIGS. 1A-1J are cross-sectional views illustrating semiconductor devices, according to various embodiments of the present inventive concepts. Referring now to FIG. 1A, a semiconductor device may include a structure that includes an n-type semiconductor layer 100 and a metal contact 110 including a heavy Alkaline Earth Metal (AEM) on the n-type semiconductor layer 100. For example, as illustrated in FIG. 1A, the heavy AEM of the metal contact 110 may be at an interface between the metal contact 110 and the n-type semiconductor layer 100. In other words, the heavy AEM of the metal contact 110 may be directly on the n-type semiconductor layer 100. Moreover, a capping layer 120 may be on the metal contact 110, and may reduce (e.g., protect against) oxidation/reaction of the underlying heavy AEM of the metal contact 110.

The capping layer 120 may be one of various types of capping layers, such as a Titanium Nitride capping layer, that may reduce oxidation or reaction of the heavy AEM. The capping layer 120 may be deposited in-situ, without exposing the metal stack including the heavy alkaline earth metal or metals to a reactive ambient (e.g., without air exposure). In some embodiments, the capping layer 120 may be deposited by a deposition technique such as Physical Vapor Deposition (PVD), Atomic Layer Deposition (ALD), or Chemical Vapor Deposition (CVD). The capping layer 120 may have a thickness of, for example, at least 5.0 nanometers (nm).

Figure 1B:
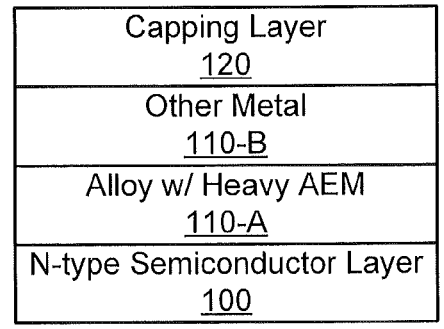

The heavy AEM may be Barium, Strontium, and/or Calcium. In other words, the metal contact 110 may include one or more heavy AEMs. In particular, one or more heavy AEMs may be used in the metal contact 110, despite apparent disadvantages of using heavy AEMs. For example, Barium can be more difficult to handle than rare earth metals, and it may be difficult to prevent a reaction of Barium because of Barium's highly-reactive nature. As another example, Calcium has often been considered detrimental to semiconductor devices. Various embodiments described herein, however, provide for forming the capping layer 120 and/or another metal layer 110-B (e.g., as illustrated in FIG. 1B) on the one or more heavy AEMs of the metal contact 110 to protect the one or more heavy AEMs from oxidation or reaction. Moreover, a thin (e.g., about 1.0-5.0 nm) layer of Barium may be used as the heavy AEM in the metal contact 110 because such a thin layer of the highly-reactive Barium may be easier to use than a thicker layer of Barium.

In some embodiments, the n-type semiconductor layer 100 may be an n-type source region or an n-type drain region of a Metal-Oxide-Semiconductor (MOS) device. Accordingly, it will be understood that the metal contact 110 illustrated in FIGS. 1A-1J may be on the n-type source region or the n-type drain region of the n-type semiconductor layer 100.

Referring now to FIG. 1B, the metal contact 110 may be a structure that includes a plurality of layers. For example, the metal contact 110 may include a metal alloy 110-A that includes the heavy AEM, and the metal contact 110 may further include another metal layer 110-B. The other metal layer 110-B may include a non-AEM such as a transition metal. In some embodiments, the other metal layer 110-B may protect against oxidation/reaction of the heavy AEM of the metal contact 110. If, however, the other metal layer 110-B does not sufficiently protect against oxidation/reaction of the heavy AEM of the metal contact 110, then the capping layer 120 may provide such protection.

In addition to the heavy AEM, the alloy 110-A may include a non-AEM such as a transition metal. The heavy AEM may provide a percentage composition of the alloy 110-A of less than about 20%. For example, the heavy AEM may be about 10% of the alloy 110-A. As an example, the alloy 110-A may have a percentage composition of 10% Barium because 10% Barium may be easier to handle/use than pure Barium, which may oxidize very easily. Moreover, in some embodiments, the alloy 110-A may include more than two components. For example, the alloy 110-A may include a plurality of non-alkaline-earth metals and/or a plurality of heavy AEMs.

In some embodiments, a metallic alloy 110-A including a heavy AEM may be formed by reacting a heavy AEM, or a metallic alloy including a heavy AEM, with the n-type semiconductor layer 100, to form a metallic compound such as a heavy AEM silicide (if the n-type semiconductor layer 100 includes Silicon).

In some embodiments, the metal contact 110 may not include any elements that are detrimental and/or harmful to Metal-Oxide-Semiconductor (MOS) devices, including elements such as halides (e.g., chlorine or iodine). Moreover, the metal contact 110 may be solid (e.g., rather than liquid), metallic, conductive, and unoxidized. For example, the alloy 110-A including the heavy AEM may be non-halide, solid, metallic, conductive, and unoxidized.

Figure 1C:
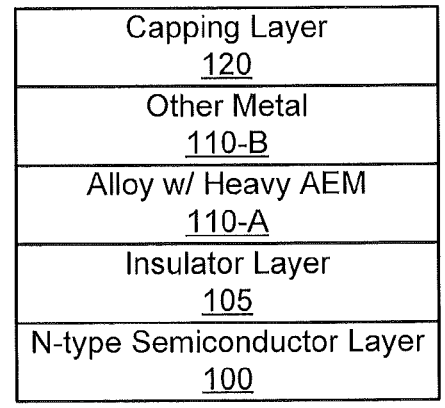
Figure 1H:
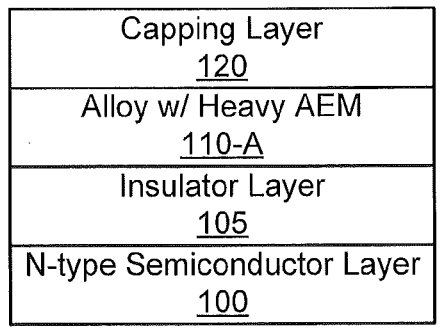

Referring now to FIG. 1C, an insulator (i.e., insulating) layer 105 may optionally intervene between the n-type semiconductor layer 100 and the alloy 110-A including the heavy AEM. The insulator layer 105 may be, for example, Titanium Oxide or Zinc Oxide. The insulator layer 105 may be a thin layer having a thickness of, for example, no more than about 2.0 nm. Moreover, the alloy 110-A including the heavy AEM may have a thickness of, for example, no more than about 10.0 nm.

Referring now to FIG. 1D, as an alternative to the alloy 110-A, the metal contact 110 may include a layer 110-A' of a pure (i.e., non-alloyed) form of the heavy AEM. In other words, the layer 110-A' may include pure Barium, pure Strontium, or pure Calcium. Accordingly, the heavy AEM may be in pure form, or may be alloyed with one or more other metals, and may be layered with a non-alkaline-earth metal (e.g., the other metal layer 110-B) or metals to form a multi-layer structure (2 or more layers).

Referring now to FIG. 1E, as an alternative to the insulator layer 105, a chalcogenide material 106 (e.g., a material providing chalcogenide interface passivation) may optionally intervene between the n-type semiconductor layer 100 and the layer 110-A' of pure heavy AEM. Moreover, it will be understood that the chalcogenide material 106 may optionally intervene between the n-type semiconductor layer 100 and the alloy 110-A (e.g., the alloy 110-A illustrated in FIG. 1C) including the heavy AEM.

Referring now to FIG. 1F, the layer 110-A' of pure heavy AEM and the other metal layer 110-B may be repeatedly and alternatingly stacked. Accordingly, the metal contact 110 may include a plurality of the layers 110-A' of pure heavy AEM and a plurality of the other metal layers 110-B.

It will be understood that the layers illustrated in FIG. 1F are for purposes of explanation and that the alternating layers 110-A' and 110-B may therefore individually have smaller thicknesses than if the layers 110-A' and 110-B were not repeatedly stacked. For example, individual ones of the layers 110-A' and 110-B of the structure illustrated in FIG. 1F may be thinner than either of the layers 110-A' and 110-B of the structure illustrated in FIG. 1D. Individual ones of the layers 110-A' and 110-B of the semiconductor device illustrated in FIG. 1F may also be thinner than either of the n-type semiconductor layer 100 and the capping layer 120 illustrated in FIG. 1F.

Moreover, referring to each of FIGS. 1A-1J, it will be understood that the layers illustrated therein are provided for purposes of explanation and are not necessarily indicative of relative thicknesses. As an example, it will be understood that the alloy 110-A may be thinner than individual ones of the other metal layer 110-B, the capping layer 120, and the n-type semiconductor layer 100. In some embodiments, a stack structure illustrated in one of FIGS. 1A-1J may be a nanolaminate structure or may include a portion that is a nanolaminate. In other words, some or all of the layers of the stack structure may have a thickness of a few nanometers (nm) or, in some embodiments, less than 2 nm. As an example, the first layer (i.e., the layer closest to an interface with the semiconductor layer 100) of the metal contact 110 may include or may be fully composed of a heavy AEM, and this first layer may be less than 2 nm thick.

Referring now to FIG. 1G, the metal contact 110 may include the alloy 110-A including a heavy AEM on the layer 110-A' of pure heavy AEM. Alternatively, referring now to FIG. 1H, the metal contact 110 may include the alloy 110-A including the heavy AEM directly between the capping layer 120 and either the optional insulator layer 105 or the n-type semiconductor layer 100.

Figure 1I:
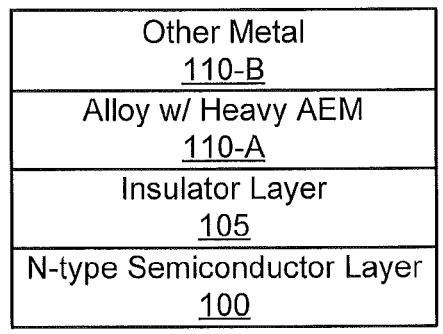

Referring now to FIG. 1I, it will be understood that the capping layer 120 of FIGS. 1B-1F may be optional. In particular, the other metal layer 110-B may be sufficient to protect against oxidation/reaction of the heavy AEM of the metal contact 110. Accordingly, the capping layer 120 may be optional in embodiments where the other metal layer 110-B provides sufficient protection.

Figure 1J:
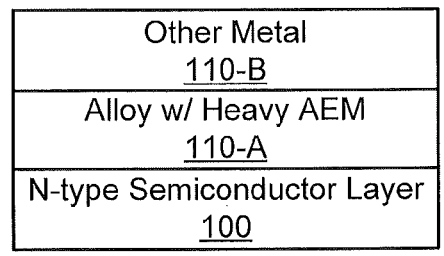

Referring now to FIG. 1J, the insulator layer 105 of FIGS. 1C, 1D, and 1F-1I may be optional. Moreover, in some embodiments, both of the capping layer 120 and the insulator layer 105 may be omitted, as illustrated in the example of Figure IJ. In some embodiments, the capping layer 120 may be omitted if the other metal layer 110-B deposited on top of the heavy AEM, or on top of the alloy 110-A including the heavy AEM, provides sufficient protection against oxidation.

Figure 2A:
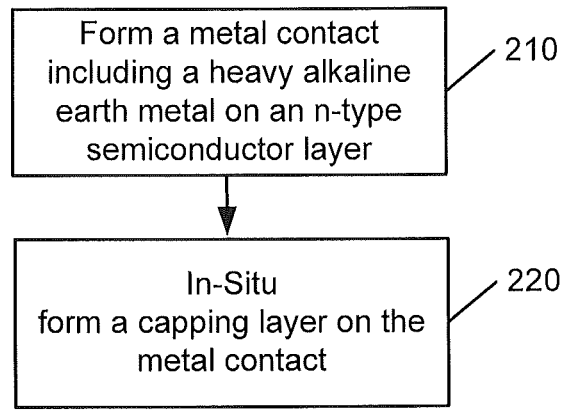
FIGS. 2A-2I, 3A, 3B, and 4-6 are flowcharts illustrating operations of forming semiconductor devices, according to various embodiments of the present inventive concepts.

FIGS. 2A-2I, 3A, 3B, and 4-6 are flowcharts illustrating operations of forming semiconductor devices, according to various embodiments of the present inventive concepts. In particular, FIGS. 2A-2I illustrate operations of forming the structures illustrated in FIGS. 1A-1I, respectively. Moreover, when the optional operations in Block 200 of FIG. 2I are omitted, FIG. 2I illustrates operations of forming the structure illustrated in FIG. 1J. Referring now to FIG. 2A (and referring again to the structure of FIG. 1A), operations of forming a semiconductor device may include forming (Block 210) a metal contact 110 including a heavy AEM, on an n-type semiconductor layer 100. For example, the metal contact 110 may be formed on an exposed surface of the n-type semiconductor layer 100. The operations may also include forming in-situ (Block 220) a capping layer 120 on the metal contact 110.

Figure 2B:
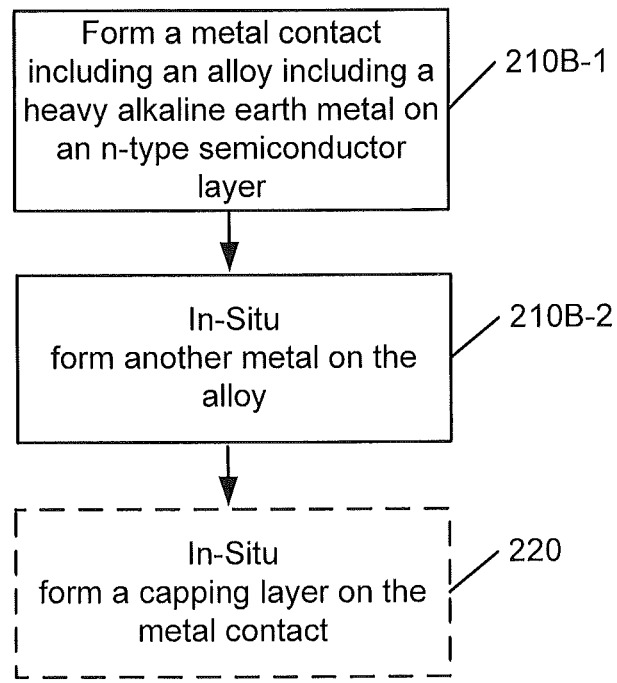

Referring now to FIG. 2B (and referring again to the structure of FIG. 1B), operations of forming the metal contact 110 may include forming (Block 210B-1) a metal contact 110 including an alloy 110-A that includes a heavy AEM, on the n-type semiconductor layer 100. The operations may also include forming in-situ (Block 210B-2) another metal layer 110-B, on the alloy 110-A. Moreover, as discussed above regarding FIG. 1B, in some embodiments, the other metal layer 110-B may protect against oxidation/reaction of the heavy AEM of the alloy 110-A. Accordingly, operations of forming in-situ (Block 220) the capping layer 120 may be omitted if the other metal layer 110-B provides sufficient protection for the heavy AEM.

Figure 2C:
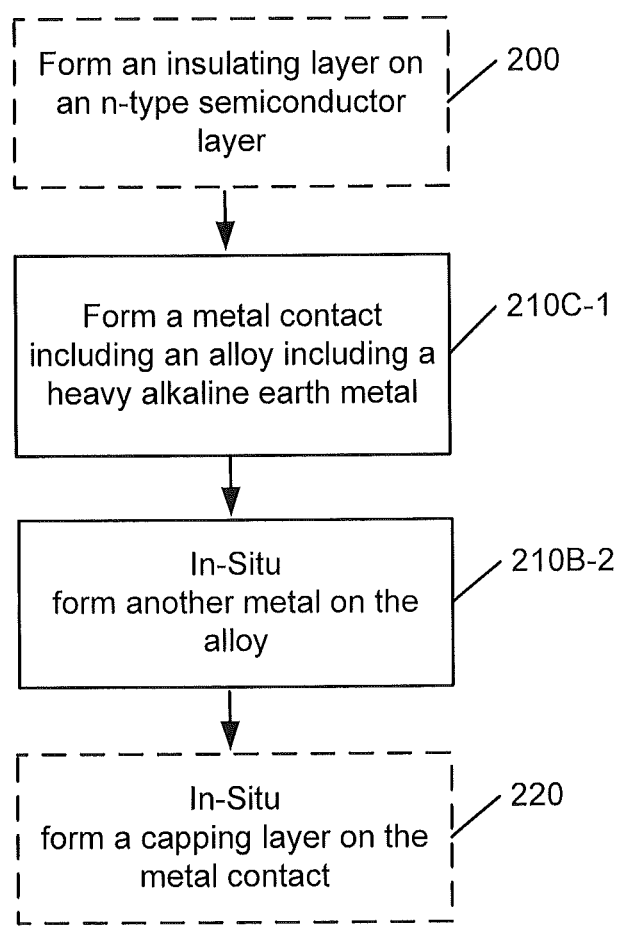

Referring now to FIG. 2C (and referring again to the structure of FIG. 1C), operations of forming a semiconductor device may optionally include forming (Block 200) an insulator (i.e., insulating) layer 105 on the n-type semiconductor layer 100. Accordingly, operations of forming the metal contact 110 may include forming (Block 210C-1) a metal contact 110 including the alloy 110-A including the AEM, on the insulator layer 105.

Figure 2D:
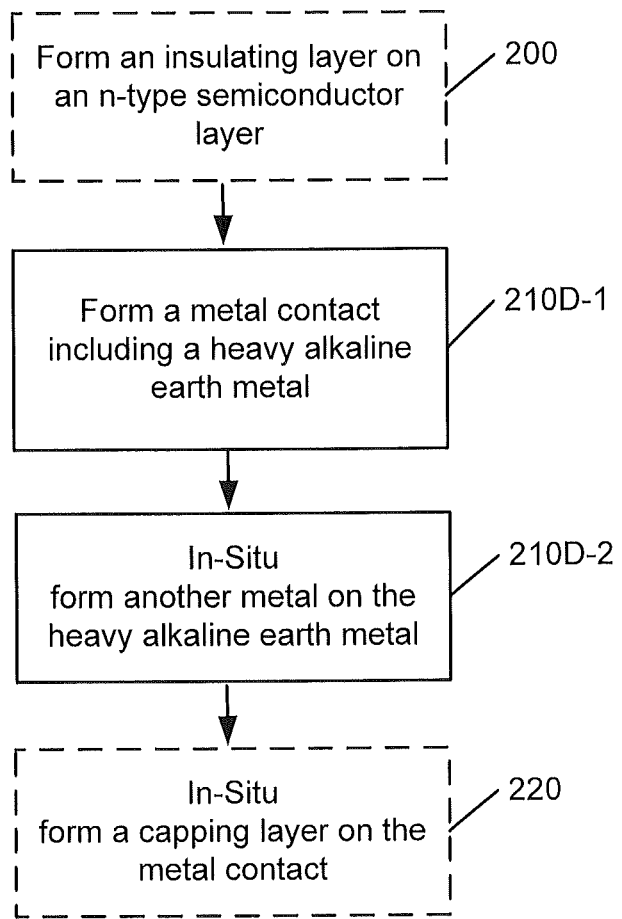

Referring now to FIG. 2D (and referring again to the structure of FIG. 1D), operations of forming the metal contact 110 may include forming (Block 210D-1) a metal contact 110 including a layer 110-A' of a pure (i.e., non-alloyed) form of the heavy AEM. The operations may also include forming in-situ (Block 210D-2) another metal 110-B on the layer 110-A' of pure heavy AEM.

Figure 2E:
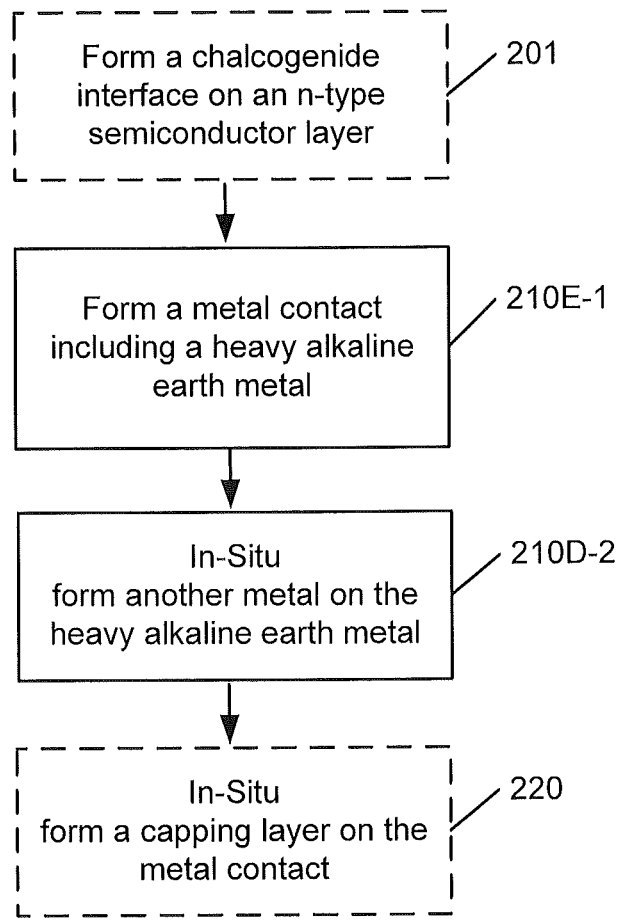

Referring now to FIG. 2E (and referring again to the structure of FIG. 1E), operations of forming a semiconductor device may optionally include forming (Block 201) a chalcogenide material 106 (e.g., a material providing chalcogenide interface passivation, such as Sulfur or Selenium interface passivation) on the n-type semiconductor layer 100. The operations may also include forming (Block 210E-1) a metal contact 110 including the layer 110-A' of pure heavy AEM, on the chalcogenide material 106. Moreover, it will be understood that the operations may alternatively include forming the alloy 110-A (e.g., the alloy 110-A illustrated in FIG. 1C) including the heavy AEM on the chalcogenide material 106.

Forming the chalcogenide material 106 is one example of an operation that may reduce Fermi Level Pinning (FLP). In particular, passivation with a chalcogenide material 106 may be provided by incorporation of a chalcogenide through an implantation step, a plasma step, a chemical step, etc., optionally followed by anneals. Another example is the deposition of a thin layer of an insulator (e.g., the insulator layer 105 illustrated in FIG. 1C) on a surface of the semiconductor layer 100, to form a Metal-Insulator-Semiconductor (MIS) contact. In some embodiments, operations that may reduce FLP may be omitted. In some embodiments, the chalcogenide material may be formed by implantation of a chalcogenide after deposition of the heavy AEM or alloy(s) including the heavy AEM and other metal layers or capping layers (so that the heavy AEM or alloy(s) including the heavy AEM may be protected from oxidation during the implantation step), followed by a thermal step to drive the chalcogenide toward the metal/semiconductor interface.

Figure 2F:
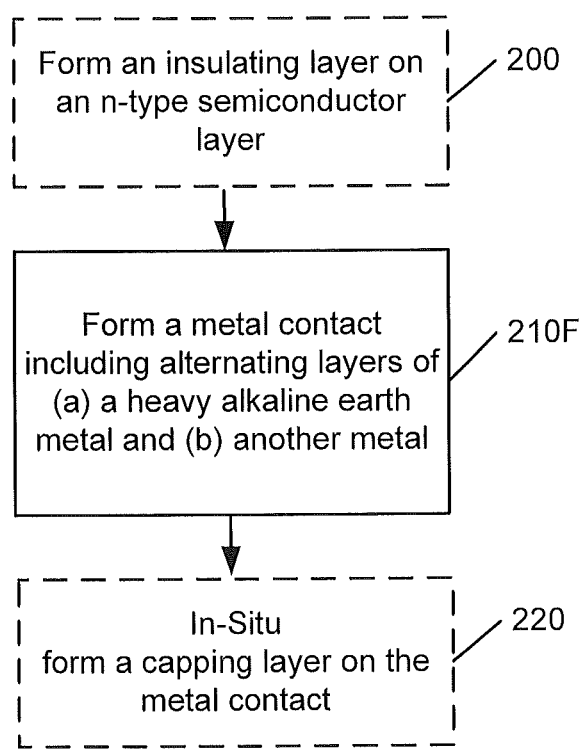

Referring now to FIG. 2F, (and referring again to the structure of FIG. 1F), operations of forming the metal contact 110 may include forming (Block 210F) a metal contact 110 that includes alternating layers of (a) a layer 110-A' of pure heavy AEM and (b) another metal layer 110-B. In particular, the operations of Block 210F may include forming a plurality of the layers 110-A' of pure heavy AEM and a plurality of the other metal layers 110-B, such that each of the layers 110-A' of pure heavy AEM directly underlies one of the other metal layers 110-B. The operations of forming the layers 110-A' and layers 110-B may be carried out without exposing the layers to oxidizing ambients, until adequate protection against oxidation of the layers 110-A' is provided.

Figure 2G:
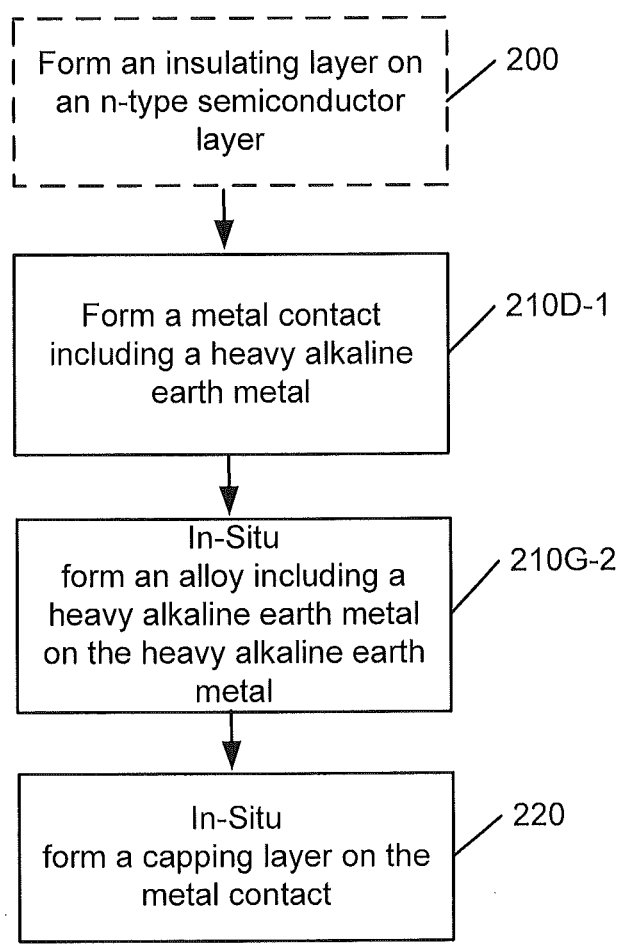

Referring now to FIG. 2G (and referring again to the structure of FIG. 1G), operations of forming a semiconductor device may include forming (Block 210G-2) an alloy 110-A that includes a heavy AEM, on a layer 110-A' of pure heavy AEM.

Figure 2H:
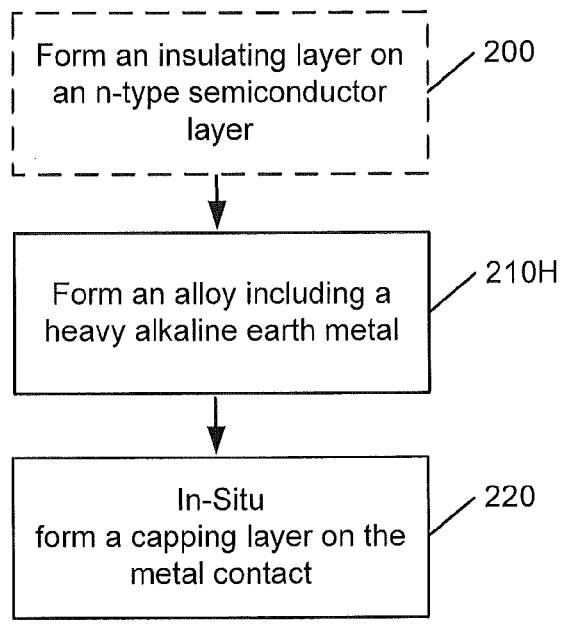
Figure 2I:
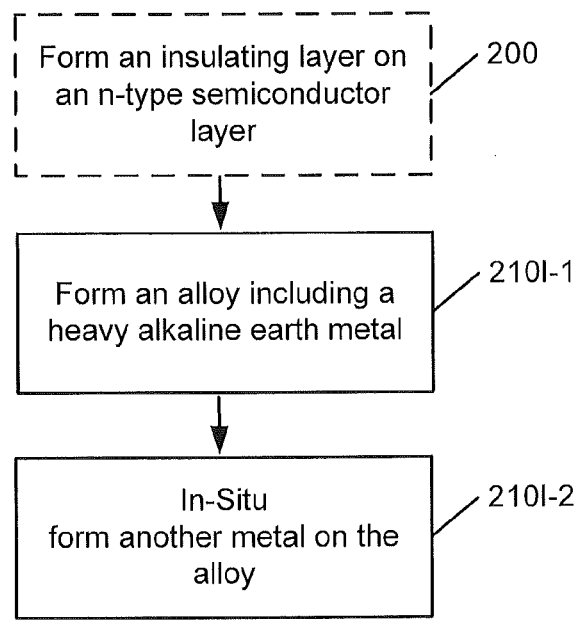

Referring now to FIG. 2H (and referring again to the structure of FIG. 1H), operations of forming a semiconductor device may include forming (Block 210H) an alloy 110-A that includes the heavy AEM, without forming another metal layer (e.g., the other metal layer 110-B) between the alloy 110-A and the capping layer 120.

Referring now to FIG. 2I, operations of forming a semiconductor device may include forming (Block 210I-1) an alloy 110-A that includes the heavy AEM, on the n-type semiconductor layer 100, and forming in-situ (Block 210I-2) another metal layer 110-B on the alloy 110-A, without forming the capping layer 120. For example, as discussed above regarding FIG. 1I, the capping layer 120 may be optional in embodiments where the other metal layer 110-B provides sufficient protection against oxidation/reaction of the heavy AEM of the metal contact 110. The structures of FIGS. 1I and 1J both illustrate structures in which the capping layer 120 has been omitted. Moreover, the structure of FIG. 1J illustrates that both the capping layer 120 and the insulator layer 105 may be omitted, in some embodiments.

Figure 3A:
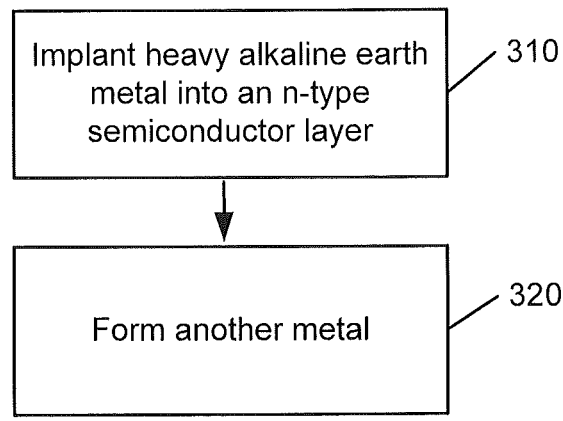
Figure 3B:
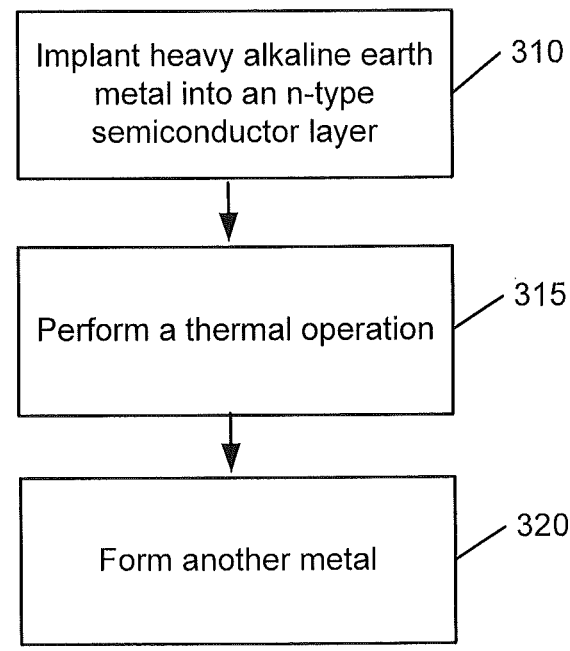
Figure 4:
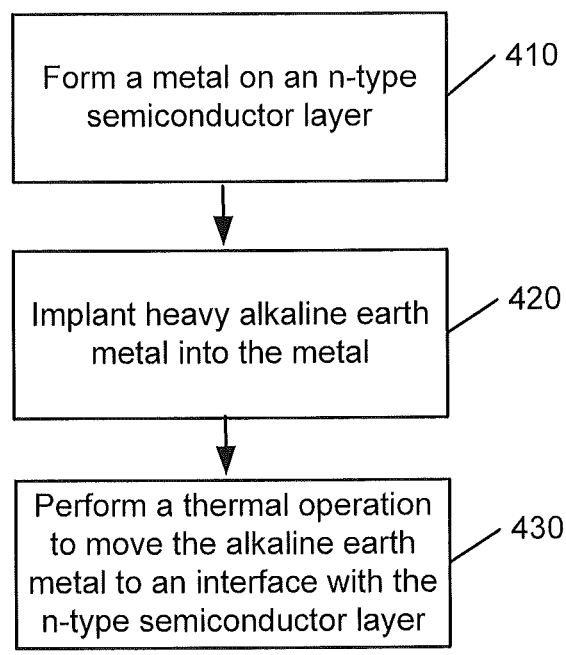

Referring to FIGS. 3A, 3B, and 4, operations of forming a metal contact 110 may include implantation of the heavy AEM. For example, referring now to FIG. 3A, the operations may include implanting (Block 310) the heavy AEM into the n-type semiconductor layer 100. The operations may also include forming (Block 320) another metal layer 110-B on the n-type semiconductor layer 100. Referring to FIGS. 3A and 3B, the operation of forming (Block 320) another metal layer 110-B may involve a reaction of a deposited metal layer with the n-type semiconductor layer 100 to form a compound metallic layer. If a reaction operation is used in Block 320, some of the heavy AEM implanted into the n-type semiconductor layer 100 may be segregated to a region of the interface between the metallic compound and the n-n-type semiconductor layer 100. Referring to FIG. 3B, a thermal operation (Block 315) may be performed after implanting (Block 310) the heavy AEM into the n-type semiconductor layer 100, to move some of the heavy AEM to a surface (e.g., an uppermost surface) of the n-type semiconductor layer 100.

Referring now to FIG. 4, operations of forming a metal contact 110 may include forming (Block 410) a metal layer (e.g., the other metal layer 110-B) on the n-type semiconductor layer 100. The operations may also include forming the capping layer 120 on the metal layer (e.g., as illustrated in Block 220 of FIG. 2A). The operations may additionally include implanting (Block 420) the heavy AEM through the capping layer 120 into the metal layer. Moreover, the operations may include performing (Block 430) a thermal operation (e.g., an anneal) to move the heavy AEM to an interface with (e.g., toward a surface of) the n-type semiconductor layer 100. As an example, the heavy AEM may be incorporated by ion implantation, followed by a segregation anneal to drive it to the interface with the n-type semiconductor layer 100, at all times having the capping layer 120 on top of the stack.

Accordingly, it will be understood that the operations in FIG. 2A may be performed in reverse order, where the metal contact 110 is formed via implantation of the heavy AEM through the capping layer 120. In other words, the metal contact 110 may be formed after forming the capping layer 120, in some embodiments.

Figure 5:
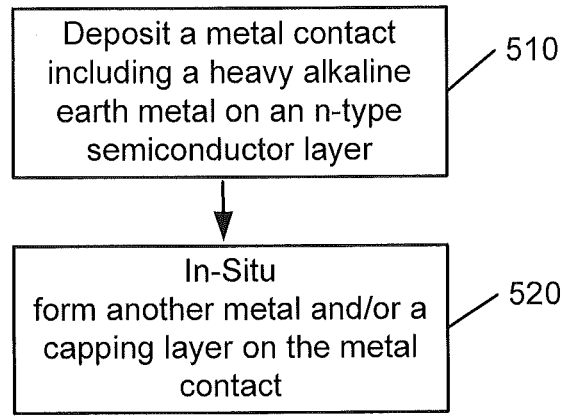

Referring now to FIG. 5, it will be understood that the operations in FIGS. 2A-2I of forming the metal contact 110 may include depositing (Block 510) (rather than implanting/reacting) the metal contact 110. Operations of depositing the metal contact 110 may include a conformal deposition technique such as Atomic Layer Deposition (ALD) or Chemical Vapor Deposition (CVD), a deposition technique such as Physical Vapor Deposition (PVD), or any other deposition technique. Moreover, the operations of FIG. 5 may include forming (Block 520) another metal layer 110-B and/or the capping layer 120 on the metal contact 110. It will be understood that a deposition technique may be used to form any of the alloy 110-A, the layer 110-A' of pure heavy AEM, or the other metal 110-B.

In some embodiments, the alloy 110-A may be deposited from a single composite target. As an example, deposition may be achieved by PVD from a single alloy target. Alternatively, the alloy 110-A may be co-deposited from more than one target. Alternatively, the alloy 110-A may be deposited by other techniques such as Atomic Layer Deposition (ALD) or Chemical Vapor Deposition (CVD).

Figure 6:
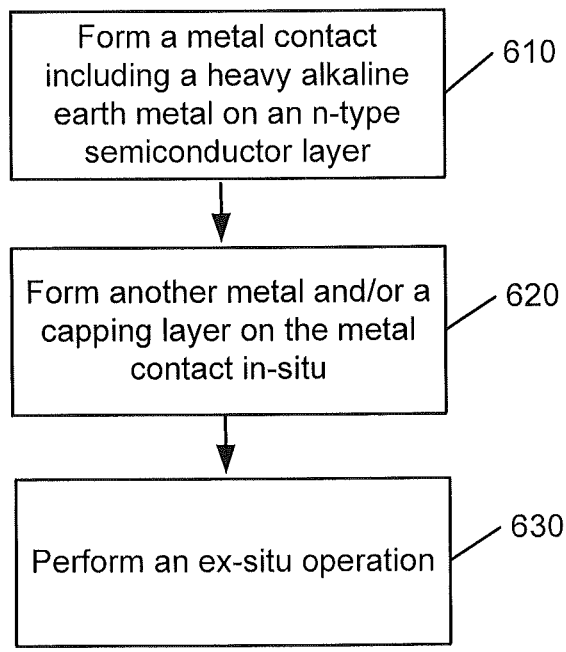

Referring now to FIG. 6, it will be understood that operations of forming another metal layer 110-B and/or the capping layer 120 may include forming (Block 620) the other metal layer 110-B and/or the capping layer 120 in-situ after forming (Block 610) the metal contact 110 including the heavy AEM on the n-type semiconductor layer 100. In particular, it will be understood that the operations in FIGS. 2A-2I of forming the metal layer 110-B and/or the capping layer 120 may be performed in-situ. Moreover, after forming the other metal layer 110-B and/or the capping layer 120 on the heavy AEM, the operations may include performing (Block 630) an ex-situ operation on a structure that includes both (a) the heavy AEM and (b) the other metal layer 110-B and/or the capping layer 120.

In other words, the metal layer 110-B and/or the capping layer 120 may be formed without substantially oxidizing or reacting the heavy AEM of the layer 110-A' or the alloy 110-A. The entire stack structure (e.g., an entire structure illustrated in FIGS. 1A-1J) may be deposited in-situ (without exposure to a reactive ambient). The top layer(s) (e.g., the capping layer 120 and/or the other metal layer 110-B) of the stack may not include heavy AEMs and may provide a barrier that reduces reaction of the heavy AEM(s) (i.e., may act as a capping layer). Additional layers may be deposited ex-situ (i.e., with a vacuum break) after a layer that reduces reaction of the heavy AEM(s) is in place. For example, one or more additional layers may be deposited ex-situ in the operation of Block 630 of FIG. 6.

Accordingly, various embodiments illustrated in FIGS. 2A-6 may provide operations of forming a semiconductor device that includes a low-resistivity contact (e.g., the metal contact 110) to an n-type semiconductor (e.g., the n-type semiconductor layer 100). In particular, the operations may include forming a low-resistivity contact using a heavy AEM, such as Strontium (Sr), Barium (Ba), or Calcium (Ca) as part of the composition and layer structure of the low-resistivity metal contact to the n-type semiconductor. Specifically, heavy AEMs, with some of the lowest work functions (WFs) of any metal, may be used in contacts to n-type semiconductors and may provide some of the lowest Schottky Barrier Heights (SBHs) possible, thus enabling low-resistivity contacts.

In addition to using a heavy AEM, or its alloy in metallic form, in a contact scheme with an n-type semiconductor, some embodiments may provide for reducing oxidation or reaction of the heavy AEM by protecting with heavy AEM with the other metal layer 110-B and/or the capping layer 120. Accordingly, various example embodiments of the present inventive concepts may provide low-resistivity metal contact to an n-type semiconductor with a low barrier height and methods to fabricate the contact that reduce reaction of any reactive metals therein. Moreover, in some embodiments, reduction of parasitic resistance arising from low resistivity contacts may be achieved.

Additionally, it will be understood that a low-resistivity contact may be used alone or may be used in combination with any technique to reduce Fermi Level Pinning (FLP), such as chalcogenide interface passivation or Metal-Insulator-Semiconductor (MIS) contacts. A metal alloy and/or a metal layered structure including one or more heavy alkaline earth metals (e.g., Sr, Ca, and/or Ba) described herein may contact an n-type semiconductor, either directly or with an interfacial treatment (e.g., one or more chalcogenides at the interface) or with a thin interfacial layer separating the metal from the semiconductor (such as in an MIS contact). Metal alloys and/or metal layered structures including heavy AEMs may be solids. Moreover, the low-resistivity contact may, according to some embodiments, be an ohmic contact.

In some embodiments, a metal stack structure including a heavy AEM may optionally be reacted (e.g., via an anneal) to form a compound with an n-type semiconductor. In some embodiments, a metal contact to an n-type semiconductor may include one or more metallic heavy AEMs within a contact stack. Moreover, some embodiments may provide a contact that includes insulating heavy AEM compounds in MIS structures (e.g., Barium Sulfide (BaS) or Barium Titanate ($BaTiO_3$), among others). MIS structures may be combined with any amount of heavy AEMs that are in metallic form.

Although the structures illustrated in FIGS. 1A-1J indicate a heavy AEM on an n-type semiconductor layer 100, to provide a low-resistivity contact to the n-type semiconductor layer 100, it will be understood that, in some embodiments, a heavy AEM may alternatively be formed on a p-type semiconductor layer to form a Schottky diode.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed various embodiments and, although specific terms are employed, they are used in a generic and descriptive sense only and not for purposes of limitation.

What is claimed is:

1. A method of forming a semiconductor device, the method comprising:

forming a metal contact comprising a solid, conductive, metallic alloy comprising a heavy alkaline earth metal on an n-type semiconductor layer, wherein the alloy comprising the heavy alkaline earth metal comprises a thickness of no more than about 10.0 nanometers, wherein the metal contact is configured to provide a current path to the n-type semiconductor layer, and wherein forming the metal contact comprises forming an ohmic contact with the n-type semiconductor layer; and in-situ forming a metal layer and/or a capping layer on the alloy comprising the heavy alkaline earth metal.

2. The method of claim 1, wherein in-situ forming the metal layer and/or the capping layer comprises:

forming the metal layer and/or the capping layer on the alloy comprising the heavy alkaline earth metal without substantially oxidizing or reacting the heavy alkaline earth metal.

3. The method of claim 1, wherein the alloy further comprises a non-alkaline-earth metal, wherein the heavy alkaline earth metal comprises Barium, Strontium, and/or Calcium, and wherein forming the metal contact comprising the alloy comprises:

forming the metal contact comprising the alloy comprising the non-alkaline-earth metal and the less than about 20% percentage composition of the Barium, Strontium, and/or Calcium.

4. A method of forming a semiconductor device, the method comprising forming a solid, conductive metal contact comprising a substantially unoxidized heavy alkaline earth metal on an n-type semiconductor layer, wherein the substantially unoxidized heavy alkaline earth metal underlies a metal layer and/or a capping layer, and wherein forming the solid, conductive metal contact comprises forming an ohmic contact with the n-type semiconductor layer, and
wherein the solid, conductive metal contact is configured to provide a current path to the n-type semiconductor layer.

5. The method of claim 4, further comprising:
forming the metal layer and/or the capping layer on the heavy alkaline earth metal without substantially oxidizing or reacting the heavy alkaline earth metal; and
performing an ex-situ operation on a structure comprising the heavy alkaline earth metal and the metal layer and/or the capping layer, after forming the metal layer and/or the capping layer on the heavy alkaline earth metal.

6. The method of claim 5, further comprising forming an insulator layer on the n-type semiconductor layer, wherein forming the solid, conductive metal contact comprises forming the solid, conductive metal contact comprising the heavy alkaline earth metal on the insulator layer.

7. The method of claim 6,
wherein the insulator layer comprises a thickness of no more than about 2.0 nanometers (nm) on the n-type semiconductor layer,
wherein the heavy alkaline earth metal comprises a thickness of no more than about 10.0 nm on the insulator layer, and
wherein forming the solid, conductive metal contact comprises forming the solid, conductive metal contact comprising the heavy alkaline earth metal comprising the thickness of no more than about 10.0 nm on the insulator layer comprising the thickness of no more than about 2.0 nm.

8. The method of claim 4, wherein forming the solid, conductive metal contact comprises:
forming the heavy alkaline earth metal directly contacting the n-type semiconductor layer.

9. The method of claim 4, further comprising forming a chalcogenide material on the n-type semiconductor layer, wherein forming the solid, conductive metal contact comprises forming the solid, conductive metal contact comprising the heavy alkaline earth metal on the chalcogenide material.

10. The method of claim 4, wherein forming the solid, conductive metal contact comprises:
implanting the heavy alkaline earth metal into the n-type semiconductor layer; and
forming the metal layer on the heavy alkaline earth metal to cause a reaction that moves the heavy alkaline earth metal to a surface of the n-type semiconductor layer.

11. The method of claim 4, wherein forming the solid, conductive metal contact comprises:
forming the metal layer on the n-type semiconductor layer;
forming the capping layer on the metal layer;
implanting the heavy alkaline earth metal through the capping layer into the metal layer; and
performing a thermal operation to move the heavy alkaline earth metal toward a surface of the n-type semiconductor layer.

12. The method of claim 4,
wherein the semiconductor device comprises a Metal-Oxide-Semiconductor (MOS) device,
wherein the n-type semiconductor layer comprises an n-type source region or an n-type drain region of the MOS device, and
wherein forming the solid, conductive metal contact comprises:
forming the solid, conductive metal contact comprising the heavy alkaline earth metal on the n-type source region or the n-type drain region of the n-type semiconductor layer.

13. The method of claim 4,
wherein the heavy alkaline earth metal comprises Barium, Strontium, and/or Calcium, and
wherein forming the solid, conductive metal contact comprises:
forming the solid, conductive metal contact comprising the heavy alkaline earth metal comprising Barium, Strontium, and/or Calcium on the n-type semiconductor layer.

14. A semiconductor device, comprising:
an n-type semiconductor layer;
a substantially unoxidized metal contact comprising a solid, conductive, metallic alloy comprising a heavy alkaline earth metal on the n-type semiconductor layer, wherein the alloy comprising the heavy alkaline earth metal comprises a thickness of no more than about 10.0 nanometers, wherein the substantially unoxidized metal contact is configured to provide a current path to the n-type semiconductor layer, and wherein the substantially unoxidized metal contact comprises an ohmic contact with the n-type semiconductor layer; and
a metal layer and/or a capping layer on the alloy comprising the heavy alkaline earth metal.

15. The device of claim 14,
wherein the heavy alkaline earth metal comprises Barium, Strontium, and/or Calcium, and
wherein the alloy comprises a non-alkaline-earth metal and a percentage composition of less than about 20% of the Barium, Strontium, and/or Calcium.

16. The device of claim 14, wherein the substantially unoxidized metal contact directly contacts the n-type semiconductor layer.

17. The method of claim 1, wherein forming the metal contact comprises forming the heavy alkaline earth metal to directly contact the n-type semiconductor layer.

* * * * *